United States Patent [19]

Laakaniemi et al.

[11] 4,188,977

[45] Feb. 19, 1980

[54] FLUID SYSTEM CIRCUIT BOARD

[75] Inventors: Richard N. Laakaniemi; Leon C. Ploszaj; Bruce R. Schultz, all of Milwaukee, Wis.

[73] Assignee: Johnson Controls, Inc., Milwaukee, Wis.

[21] Appl. No.: 895,594

[22] Filed: Apr. 12, 1978

Related U.S. Application Data

[62] Division of Ser. No. 750,650, Dec. 15, 1976, Pat. No. 4,110,140.

[51] Int. Cl.$^2$ ............................ F15C 5/00; B32B 31/04
[52] U.S. Cl. ..................................................... 137/833
[58] Field of Search ..................... 137/833; 156/330, 87

[56] References Cited

U.S. PATENT DOCUMENTS

| | | | |
|---|---|---|---|
| 3,467,124 | 9/1969 | Simson | 137/833 X |
| 3,533,428 | 10/1970 | Ruedle | 137/833 |
| 3,539,429 | 11/1970 | Kilduff et al. | 137/833 X |
| 3,548,849 | 12/1970 | Purcell et al. | 137/833 X |

Primary Examiner—William R. Cline

Attorney, Agent, or Firm—Andrus, Sceales, Starke & Sawall

[57] ABSTRACT

A fluid pneumatic circuit board includes a base plate and a flat cover plate molded of a suitable plastic such as polysulfone. The plates are chemically bonded with a thermal adhesive such as a refrigerated solid sheet of epoxy. The base plate has a planar surface within which the fluid circuit passageways, as well as structural board and component supports are integrally molded. The cover plate has individual sealing ribs formed to encircle each of the passageways. The epoxy sheet is shaped to cover the passageways, and with openings aligned with the exhaust openings in the cover plate. The plates, with the adhesive sheet therebetween, is clamped together and heated in an oven to soften the adhesive. The sealing rib has inclined sidewalls and an outer flat sealing wall, with an included angle of 60° and a tip width equal to the sheet thickness and a height equal 2½ times the sheet thickness. Moisture and/or gas in the softened plastic escape from under the tip and prevent formation of bubbles. Relatively small, reliable components can be internally mounted and bonded in place.

9 Claims, 5 Drawing Figures

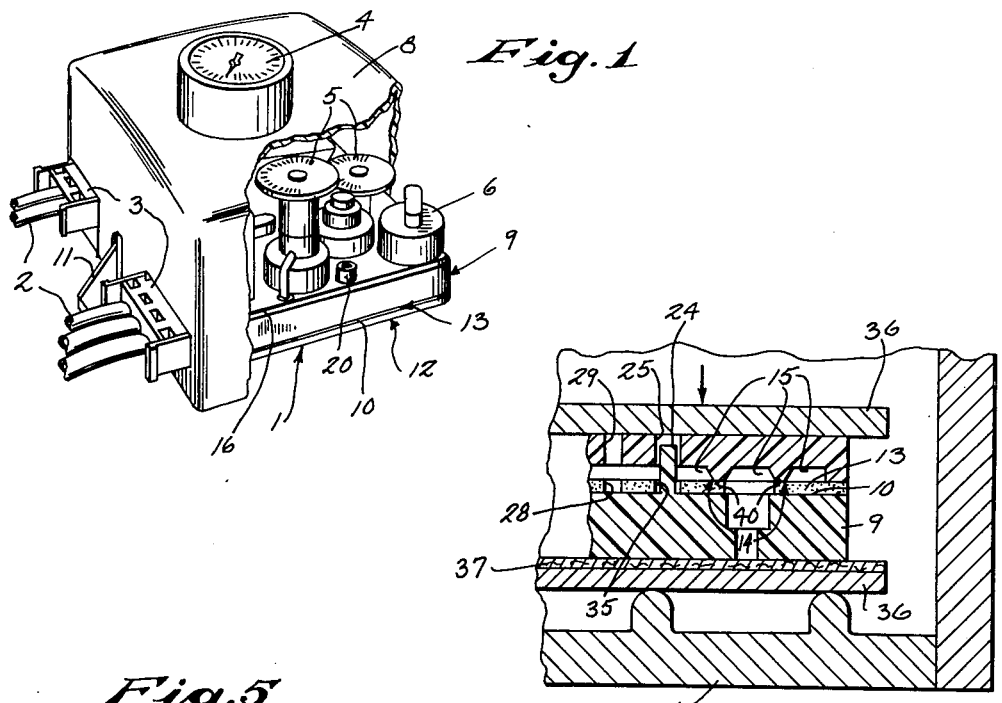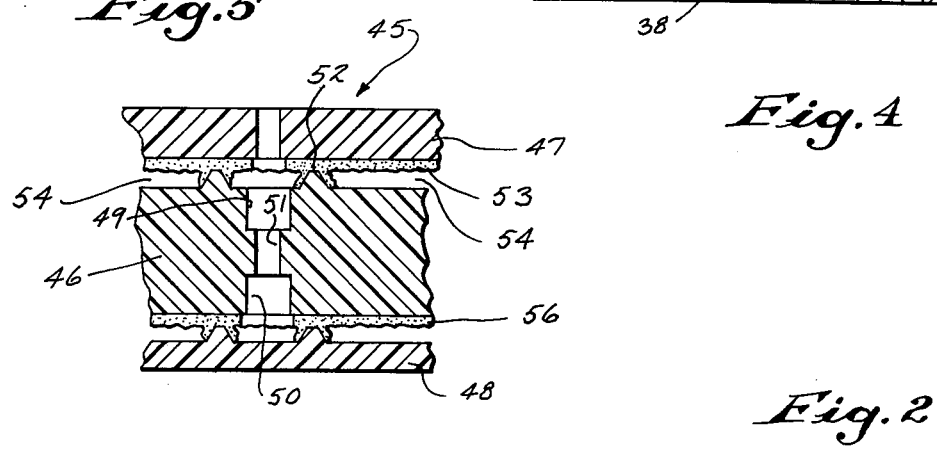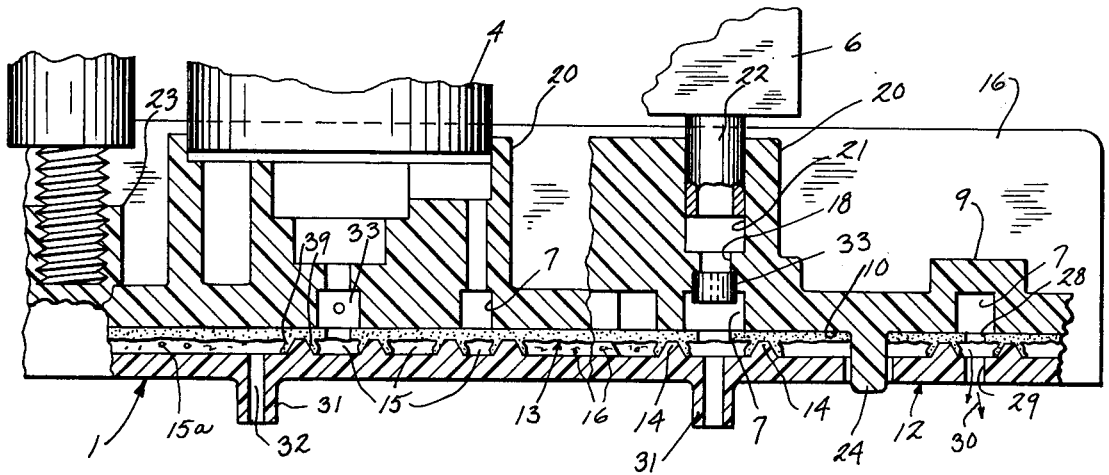

FLUID SYSTEM CIRCUIT BOARD

This is a division of application Ser. No. 750,650, filed Dec. 15, 1976, now U.S. Pat. No. 4,110,140.

BACKGROUND OF THE INVENTION

This invention relates to a fluid system circuit board for interconnecting of fluidic and/or pneumatic components into a fluid circuit or system for controlling and separating of fluid devices.

Various controls and operating systems are constructed with electrical, hydraulic and pneumatic components as well as combinations of each components depending upon particular environmental and other design specifications. Electrical systems often are conveniently constructed with printed circuit boards with printed lines and certain small components for connection to other electrical components because of the manufacturing and operating advantages associated with such construction. Fluid systems, particularly pneumatic systems have many practical advantages in many applications. The development of fluidic amplifying and logic devices have further expanded the significance of fluid systems applications. Pneumatic systems are often employed because of the ready available sources, low cost and ease of exhaust to the environment. In control systems, the simplest and common construction connects the various components with individual tubing or lines. More recent designs have suggested suitable grooved plates interconnected to each other with suitable sealing gaskets therebetween to form an integrated assembly having conduits for connection of fluid components mounted to the assembly. The use of separate tubing is, of course, a relatively high labor intensive process, which is not only costly but further results in exposed conduits which are subject to damage, disengagement and the like. The latter disadvantage can be minimized by suitable potting of the system such as in a foam plastic, epoxy or the like. Potting, of course, is also an additional manufacturing step with attendant expense. The process also requires the additional provision of exhaust connections. Mechanically interconnected grooved plates with sealing gaskets therebetween minimized the labor cost. The reliability of the system, however, is directly related to the reliability and the life of the gasket material, the mechanical fasteners and the assembly. In many cases, the gasket material deteriorates with age and may also have certain relaxation characteristics, reducing the sealing characteristic with time. The fasteners should therefore be constructed to compensate for such changes. A more recent development has employed photoetched ceramic plates which are then permanently fired to form a single unit. Etching is a relatively expensive process, however, and the cost of such circuit boards are not particularly adapted for many high volume production applications which employ fluid components.

There is, therefore, a need for a simple and low cost fluid system circuit board and a practical production method of forming such board while maintaining a reliable and relatively long operating life.

SUMMARY OF PRESENT INVENTION

The present invention is particularly directed to a multiple circuit board assembly or unit in which a plurality of plastic circuit board members are formed by molding or other suitable processing, with the necessary interconnecting passageways in the opposed faces of the members, which are then interconnected to each other with a thermally activated, compatible adhesive bonding layer and which may be constructed within normal manufacturing and environmental conditions and at a practical economical cost.

In the formation of the bond, care must be taken to maintain the location of the adhesive about each of the passageways to ensure complete and proper separation of the fluid passageways within the circuit board unit. The adhesive must not, of course, move into a passageway so as to unduly obstruct the flow path. During the heating of the adhesive, fluids such as moisture, gases or the like in the assembly, of course, tend to expand. If the fluids are not allowed to freely move from the adhesive, they will tend to force their way through the adhesive and may actually move the adhesive into a passageway. The movement of the adhesive may destroy the necessary separation of adjacent circuit passageways or adversely partially or wholly fill such a passageway within the circuit board.

Although a process could, of course, be developed to completely dry the assembly before bonding, such a process would require a special low humidity environment and would significantly increase the cost of construction. The present inventors have discovered a simple and inexpensive means of bonding the members without requirements of eliminating the fluids from the unbonded elements or the formation in a special environment.

Generally, in accordance with the present invention, the circuit board unit is formed from at least a pair of opposed members having the necessary fluid passageways, with each passageway formed in one member and sealed by the bonding to the opposite member with an adhesive layer interposed between the members. The opposed member is formed with an encircling rib which substantially encircles the passageway. The adhesive is selected to be cured at an elevated temperature and the preformed members and adhesive layer are connected to form a stacked assembly of unconnected components. The stacked assembly is clamped and placed within a suitable heating means to raise the temperature to the bonding temperature of the adhesive layer. Any moisture or gases trapped within the assembly readily escapes into the various passageways within the asembly including those defined by the sealing ribs. This has been found to essentially eliminate entrapment of fluid mediums within assembly and particularly eliminates adverse moving of the adhesive.

In the construction of the circuit board unit, some passageways may be formed in one member and others in the second member. In a preferred construction, however, the one member is formed as a supporting base with the several passageways formed in one surface and with the interconnecting taps for component connection provided to the opposite side. The second member is formed as a relatively thin sealing cover having encircling ribs. A suitable sheet of adhesive material is located between the base surface and the sealing cover, which upon heating bonds to the adjacent members. When the circuit board unit is constructed for pneumatic systems, the adhesive sheet and cover may be formed with appropriate aligned openings to provide system exhaust passageways for exhausting to the surrounding atmosphere.

In accordance with a preferred and unique pneumatic circuit board embodiment of the present invention, a base plate and a cover plate are formed of a suitable plastic such as polysulfone which form a permanent chemical bond with a suitable adhesive film, such as a sheet of epoxy. The base plate is molded with a planar surface within which the desired passageways are provided. The base plate member is further conveniently formed as a structural plate with the necessary board mounting elements, component supports such as hubs and protruding wall elements and inlet-outlet connectors integrally formed to the opposite side of the planar passageway surface. The second or cover plate is a thin flat member with the sealing ribs formed on the opposed surface. The epoxy sheet is formed to an appropriate shape to cover the passageways and with openings aligned with the exhaust openings in the cover plate. The total assembly with the adhesive sheet disposed therebetween is uniformly clamped together and then disposed within a suitable heating source such as an air oven. The epoxy adhesive sheets are generally refrigerated during storage resulting in some condensation during the normal assembly. Moisture and/or trapped gases are also normally found in polysulfone plastic. The film and plates thus normally include sources of gas or steam during the heat curing of the epoxy. The present invention has been found to provide a completely satisfactory and practical method of employing such material in formation of an integral circuit board unit.

Further for optimum results, the inventors have found that the sealing rib should be especially constructed with inclined sidewalls tapering downwardly to an outer flat sealing wall, with the width of the sealing wall and the depth of the rib related to the adhesive thickness.

Where the plate material is formed of a polysulfone and the adhesive is an epoxy sheet of 0.010 inches, the rib preferably defines an included angle of approximately 60°, has a tip width or sealing wall approximately equal to the film thickness and a height equal to approximately two and one-half times the film thickness. The tip width allows the moisture and/or gas to escape from under the tip without formation of bubbles sufficiently large to actually move the softened epoxy sheet. The height of the rib is sufficient to maintain a free space or chamber between the cover plate and the epoxy film allows free movement of moisture, gases and the like as well as forming a chamber within which the trapped gases can be contained.

In accordance with a further aspect of the present invention, relatively small and highly reliable components can be internally mounted within the passageways and bonded in place. Such components cannot, however, subsequently be readily maintained or replaced under normal usage.

The larger components which are mounted to the base plate may be attached in any conventional or suitable manner; such as by the well-known interference fits and the like; permitting convenient, rapid and reliable replacement and maintenance in the field and at a relatively low cost. The usual care should, of course, be taken in such a system to maintain the integrity of the system including the sealing of interconnecting joints under operating conditions such as temperature, vibration and the like.

The present invention provides a reliable and low cost fluid system circuit board which can be manufactured in a commercial manufacturing environment. The materials useable in the present invention may be conventional and readily available commercial products.

The final product is convenient to use, with the appropriate mounting and connecting means provided as required or desired for initial installation as well as subsequent adjustment, maintenance and the like. The present invention thus provides a highly improved and low cost fluid system circuit board.

BRIEF DESCRIPTION OF DRAWINGS

The drawings furnished herewith illustrate a preferred construction of the present invention in which the above advantages and features are clearly disclosed as well as others which will be readily understood from the following description.

In the drawings:

FIG. 1 is pictorial view of a fluid system circuit board and installation constructed in accordance with the present invention;

FIG. 2 is an enlarged vertical section of a portion of the circuit board unit shown in FIG. 1;

FIG. 4 is a fragmentary vertical section showing a step in the formation of the circuit board;

FIG. 5 is an enlarged vertical section showing an alternate embodiment of the invention.

DESCRIPTION OF THE ILLUSTRATED EMBODIMENTS

Figure 3:
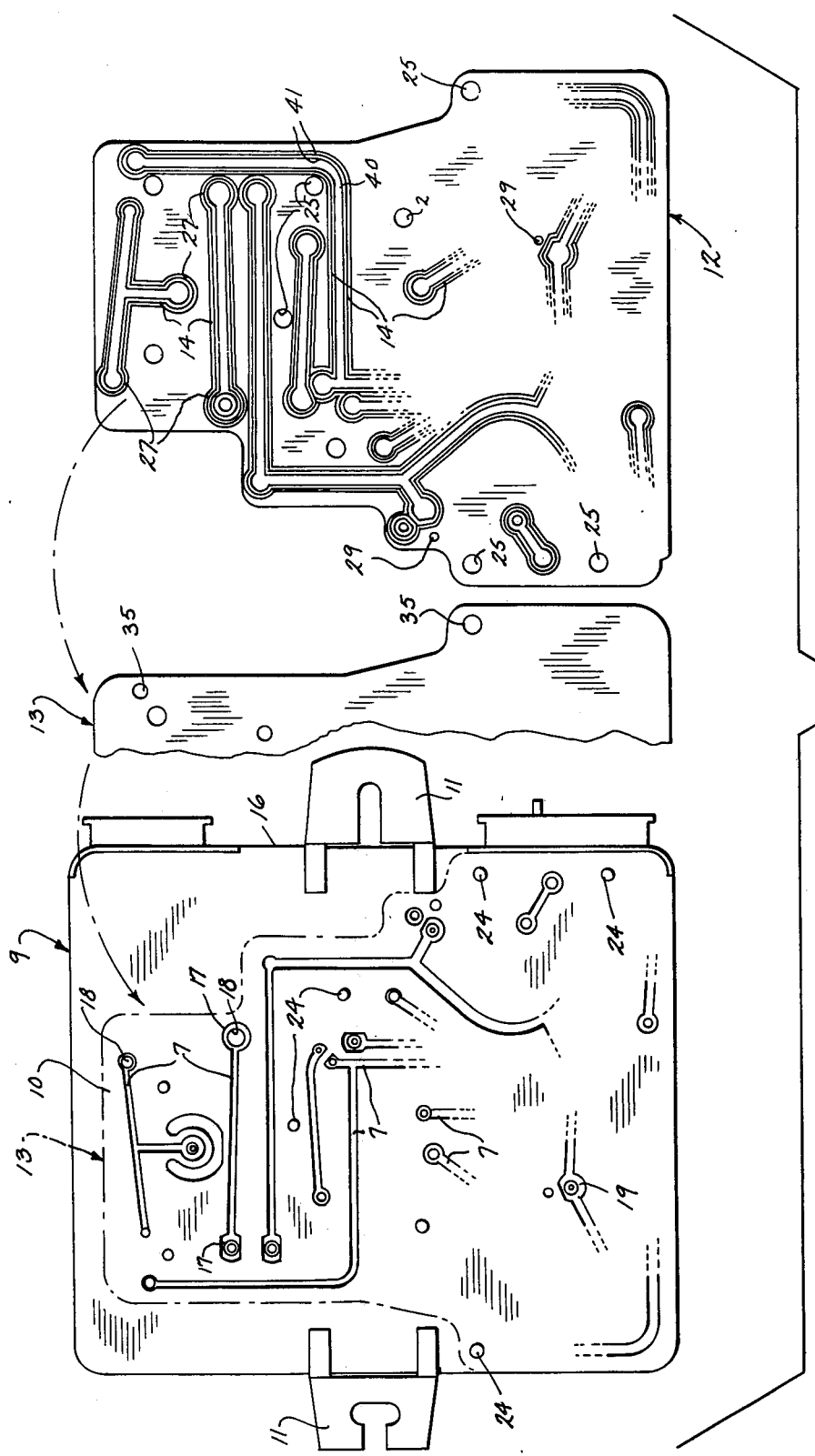
FIG. 3 is an exploded view illustrating the basic components of the circuit board.

Referring to the drawings and particularly to FIG. 1, a fluid system circuit board 1 illustrating an embodiment of the invention is shown having a plurality of input-output supply lines 2 connected through suitable plug-in type connectors 3 to one side thereof. Circuit board 1 is generally a rectangular box-like construction having a plurality of circuit components 4,5, and 6 mounted to the top wall thereof. The circuit components 4–6 may be of any conventional or desired variety such as meters, pressure and flow regulators as well as passive and active fluid circuit elements such as fluid capacitors, fluidic amplifiers and the like. The elements 4–6 are mounted to the circuit board unit 1 and interconnected to each other and to the input-output lines 2 through internal passageways 7 within the circuit board 1, as clearly shown in FIGS. 2–3. A snap-on plastic cover 8 may be provided to enclose the externally mounted components.

The present invention is particularly directed to the method and structure of the fluid circuit board unit 1 which is uniquely constructed of a plurality of members adhesively bonded to form a single integral structure with the desired and necessary internal fluid passageways 7 formed between the members. The particularly configuration and number of passageways 7 as well as the external components and connections is dictated by the system design and may, of course, be of any desired circuit. Such features are therefore not further discussed herein other than as necessary to clearly and fully explain the illustrated embodiment of this invention.

More particularly, in the illustrated embodiment of the invention, a basically two-part circuit board 1 is illustrated including a relatively heavy base plate 9 having a planar surface or wall 10 having internal grooves or recesses defining the internal fluid passageways 7 for the several components connected to the circuit board. The base plate 9 further is formed with a sidewall and integral support or mounting flanges 11 for mounting of the circuit board unit 1 and supported components 4–6 to a suitable supporting structure. A cover plate 12 is secured overlying the planar wall 10 of base plate 9 for closing of the grooves and forming passageways 7. The cover plate 12 is intimately secured to the base plate 9 by an interposed adhesive layer 13 which is selected to chemically and intimately bond to the plate 9 and to the cover 12 in response to heating of the layer to a melting temperature. In accordance with a significant aspect of the present invention, the cover 12 includes novel protrusions or ribs 14 constructed and aligned to essentially close or surround each of the separate interconnecting passageways 7. As hereinafter more fully described, such ribs 14 define chambers 15 between adhesive layer 13 and cover plate 12 within which gases 15a may move and accumulate during the thermal bonding of the adhesive layer 13 to the adjacent base plate 9 and cover plate 12.

More particularly, the base plate 9 is shown as a molded plastic component which is generally dish shaped and includes the flat bottom wall 10 with an upwardly extending encircling sidewall 16. The grooves or passageways 7 are integrally cast or molded with the base plate sidewall 16. The connecting grooves or passageways 7 are, of course, configured to provide the desired flow between the several components 4–6, and generally include a plurality of individual connecting passageways of different sizes or cross-sections. As shown in FIG. 3, passageways 7 generally terminate in slight recess as at 17, within which a connecting opening 18 may be provided; as well as at appropriate intermediate points 19. Where the groove defines an essentially dead-ended chamber, a single opening is, of course, provided. As such detail will readily be apparent to those associated with the design of fluidic circuit systems, the particularly illustrated embodiment of the lines and interconnections is not further described. The base plate 9 is further formed with integral molded embossments or support hubs 20 to the opposite side of the several components 4–6. The embossments or enlargements 20 may be tubular wall members having openings 21 aligned with the interconnecting openings 18 and adapted to receive a press-fitted tube member 22 or the like. Alternately, they may be relatively heavy hubs or like tubular projections having embedded threaded members as at 23 adapted for example, to threadedly receive an interconnecting meter post, gauge, or the like.

With a simple press fit interconnection of the components, however, consideration should be given to the operating conditions such as environmental temperature and humidity, vibration and the like. Thus, in fluid systems it is, of course, highly significant to maintain proper sealing and integrity under all environmental operating conditions. Close tolerances will normally be required for interference fits and the like. The components 4–6 should also be formed of the same material as the base plate 9 or of a material having essentially the same coefficient of thermal expansion for proper interference fit type connections. Alternatively, a resilient connection or if the component materials are sufficiently resilient it can be interconnected through a stressed fit to maintain satisfactory operation in vibration environments widely different and having significant temperature changes. The base plate 9 is thus formed as a relatively heavy rigid member with the interconnecting walls and the like establishing a self-supporting structure which functions as the instrument structure, for mounting of components and mounting of the circuit board in place. The flat wall 10 is shown with a plurality of locating pins 24 for alignment of the cover plate 12 and adhesive layer 13.

The cover plate 12 is a relatively thin plastic member which is formed by molding or any other suitable process. The formed cover plate 12 is secured to the flat bottom wall 10 by the adhesive layer 13. The cover plate 12 includes aligning opening 25 located to accurately mate with pins 24 and locate the ribs 14 with the corresponding passageways 7. The ribs 14 are integrally formed and include suitable portions 27 encircling the openings 17 of the passageways 7. As shown in phantom FIG. 3, the adhesive layer 13 essentially completely covers the several grooves or passageways 7 and forms the outer enclosure wall as shown in FIG. 2. At selected locations the adhesive layer 13 is shown provided with openings 28 aligned with openings 29 in the cover 12 to define exhaust opening flow paths 30. (FIG. 2.) Thus, when applied to a pneumatic system, the exhaust flow can be directly to the surrounding atmosphere.

Although most of the connections to separate components are made through the back side of the base plate 9, the cover plate 12 may be provided with any suitable connecting means such as integrally formed tubular connectors 31 aligned with suitable holes 32 in the adhesive layer 13 for interconnection into the system circuit, where desired.

Further, in accordance with one aspect of the invention, small circuit components particuarly of a relatively small size can be bonded within the interconnecting passageways, as at 33. For example, the component may be a simple fluid restrictor or orifice which may be formed as a highly reliable and long life component. Thus, once embedded within the circuit board unit 1, and sealed, the component 33 cannot be readily or conveniently replaced. Consequently, embedded components should be carefully selected and mounted in position.

In a preferred method of construction, the plate 9 and 12 are preformed in accordance with the desired flow path configuration, with the cover plate 12 formed with novel ribs 14. A separate adhesive sheet 13 (shown in FIG. 4) is similarly preformed generally to conform to the shape of the cover 12. Sheet 13 is provided with the appropriate openings 28 for connection to the cover exhaust openings 29 and with locating openings 35 adapted to mate with locating pins 24 of plate 9. The base 9, sheet 34 and cover 12 are then assembled in stacked relation as shown in FIG. 4. The total assembly is preferably clamped together as shown by suitable clamping plates or brackets 36 located to the opposite side of the stacked assembly. A foam pad 37 is preferably inserted in the stacked clamped assembly to provide a resilient clamping of the components to each other. The clamped assembly is mounted within a suitable oven 38 for raising of the temperature of the assembly, particularly, at the interface between the adhesive sheet 13 and the plates 9 and 12. At the bonding temperature, the sheet 13 softens and bonds to the adjacent surfaces. The softened adhesive, depending upon the construction and wetting characteristics, tend to flow over the sides of the sealing ribs 14 as at 39 in FIG. 2, increasing the bond area and thereby the total strength of the connection between several members. During the thermal bonding, any moisture and/or trapped gases within the plates 9 or 12 as well as any moisture or gases appearing on the surface of the adhesive sheet 13 expands as a result of the increasing temperatures, the moisture turning to steam. The forces generated are normally sufficient to move the molten softened adhesive laterally between the base plate 9 and the cover plate 12. Sufficient movement could generate internal leakage paths or passageways. Excessive adhesive in the grooves within the base plate 9 could also adversely seal or close off the passageway or at least interfere with the free fluid flow and thus with the circuit operation. Although moisture, gases and the like may, of course, be removed from the several members or parts prior to assembly and then assembled in a suitable low humidity environment, such procedure is relatively expensive. The present inventors have found a very simple, reliable solution is provided by the provision of the ribs 14 surrounding each of the system passageways 7. The ribs 14 defines the free space or chamber 15 to the outer side of the adhesive layer 13. The moisture and gases 16 within the elements of the circuit board unit 1 move into this free space without formation of damaging bubbles or the like within the adhesive. Thus, in the absence of such free space 15 the moisture and gases might form large bubbles causing movement of the plastic or the adhesive which may result in leakage passageways and for adverse meovement of the adhesive into the air passageways and the like.

Although the adhesive layer 13 defines the outer wall of the passageways 7 and normally moves slightly into such passageways as a result of the softening similar to the movement over the ribs 14, the quantity entering the passageways 7 is not of a sufficient level to cause interference with or adverse effect on the flow system.

The inventors have further found that optimum results are obtained when the rib 14 is specially constructed with a generally truncated cross-section defining a relatively narrow sealing tip 40 with angled sidewalls 41. The width of the rib tip 40 is preferably approximately equal to the thickness of the adhesive sheet 13 and the height of the rib 14 is on the order of two and one-half times the thickness. The narrow tip 40 allows the ready escape of moisture and gas from under the tip without the formation of large bubbles and movement of the softened adhesive. A rib 14 having an included angle 60° has been found to provide highly satisfactory results. The rib angle and the surface wetting characteristic permit the softened adhesive layer 13 to wet the rib 14 and move downwardly to increase the bond area and the related connecting strength, as previous noted.

Although the present invention can be applied to any materials adapted to form a fluid tight and preferably a chemical bond between the adhesive and the adjacent surfaces, a particularly satisfactory construction has resulted from the use of a molded polysulfone for the base and cover plates 9 and 12 and epoxy film in a sheet form as the adhesive layer 13. In a practical construction, the adhesive sheet of epoxy was 0.010 inches thick with the rib tip equal thereto and the depth two and one-half times such thickness. The sidewalls 14 included an angle of 60°.

The epoxy thoroughly bonds to the polysulfone members with a chemical change during bonding to create a highly permanent and reliable bond wihch maintains its intergrity over reasonable long service life. With the use of such chemical bonds, the circuit board unit 1 can be readily mass produced with sufficient reliability and minimal failure to eliminate the necessity for testing of all boards. Further, the assembly can be made employing normal "clean" factory conditions. The use of conventional plastic molding processes and the like results in a relatively low cost circuit board while maintaining at least the level of reliability associated with prior circuit board assemblies.

Although the invention has been illustrated and described in connection with the preferred embodiment of FIGS. 1-4, the construction and configurations may be varied within the teaching of this invention. Thus it is not necessary to employ a flat plate construction nor is it required to employ a single base member and an outer thin cover member. Such structure, however, is highly desirable from a practical, commercial production consideration.

In FIG. 5, a fragmentary cross-section is shown through a three-plate circuit board unit 45 having an intermediate body member 46, an outer body member 47 secured to the upper surface thereof, and a cover member 48 secured to the lower surface thereof. The member 46 is shown with oppositely located air passages or grooves 49 and 50, which may be interconnected by a connecging air passageway 51. The surface of the intermediate body member 46 is shown with an encircling rib 52. It should be noted that this provides an alternate and satisfactory construction with the ribs 52 encircling the air passage 49 formed on member 46 rather than on the cover 47. Outer member 47 is secured by an adhesive layer 53 to the opposed portion of the member 46, with the ribs 52 functioning to create chambers 54 to the opposite side from passageway 49 for free movement and release of moisture, gases and the like.

The bottom cover plate 48 is shown similar to plate 12 of the first embodiment and connected by an adhesive layer 56 to the lower surface of the body member 46.

Thus, the present invention provides a highly improved simplified fluid circuit board in which a plurality of circuit board elements or plates are permanently bonded in a high yield, low cost production process. The novel ridges or ribs practically eliminate destructive movement of the adhesive as the result of gases generated during the curing or bonding process and thus significantly contribute to the practical production of thermally bonded plastic parts.

Various modes of carrying out the invention are contemplated as being within the scope of the following claims, particularly pointing out and distinctly claiming the subject matter which is regarded as the invention.

We claim:

1. A fluid circuit board comprising at least first and second plate-like members secured to each other with opposed surfaces, said one plate-like member having fluid circuit recesses formed in a first of the opposed surfaces, said second plate-like member forming a closure for said recesses in said first member and having encircling ribs projecting outwardly from the second of the opposed surfaces, said ribs defining separation wall means extending generally parallel to and around the recesses, and an adhesive film interposed between said members and intimately bonded to said members to form an integral board, said encircling ribs defining chambers aligned with the recesses and located on the opposite side of the adhesive member from said recesses, said adhesive film extending over said recesses between the opposite sides of said encircling ribs forming fluid-fight passageways in said first of the opposed surfaces and fluid-tight chambers in said second member.

2. The fluid circuit board of claim 1 wherein said ribs have a cross-section having a flat outer sealing wall.

3. The fluid circuit board of claim 2 wherein said ribs have an outer flat sealing wall of a width substantially corresponding to the thickness of the film and have sidewalls extending laterally outwardly from the sealing wall toward the second opposed surface at an obtuse angle to the plane of the sealing wall.

4. The fluid circuit board of claim 1 wherein said adhesive film includes predetermined openings aligned with said recesses and extends continuously between said members from said openings.

5. The fluid circuit board of claim 1 wherein said first member is a molded plastic member having a flat outer wall with said passageways formed therein and component supports integrally formed to the opposite side of the wall, said second member is a molded plastic flat plate having said encircling ribs integrally formed on one side, said plate and adhesive film having aligned openings aligned with selected passageways, said adhesive film extending as a continuous element from said openings between said members.

6. The fluid circuit board of claim 5 wherein said ribs have a cross-section defining an outer flat sealing wall connected to the plate by sidewalls which extend laterally outwardly from the sealing wall.

7. The fluid circuit board of claim 6 wherein said flat sealing wall has a width corresponding to the thickness of the adhesive film overlying said passageways and said ribs have a depth equal to two and one half times said thickness.

8. The fluid circuit board of claim 7 wherein said plate-like members are formed of polysulfone and said adhesive film is an epoxy.

9. The board of claim 7 including circuit components adhesively bonded within said passageways.

* * * * *

UNITED STATES PATENT AND TRADEMARK OFFICE
CERTIFICATE OF CORRECTION

Page 1 of 2

PATENT NO. : 4,188,977
DATED : February 19, 1980
INVENTOR(S) : RICHARD N. LAAKANIEMI ET AL It is certified that error appears in the above-identified patent and that said Letters Patent are hereby corrected as shown below:

Column 4, Line 52 — After "The" cancel "particularly" and substitute therefore --- particular ---;

Column 7, Line 23 — After "adverse" cancel "meovement" and substitute therefore --- movement ---;

Column 7, Line 60 — After "bond" cancel "wihch" and substitute therefore --- which ---;

UNITED STATES PATENT AND TRADEMARK OFFICE
CERTIFICATE OF CORRECTION

PATENT NO. : 4,188,977

DATED : February 19, 1980

INVENTOR(S) : RICHARD N. LAAKANIEMI ET AL

It is certified that error appears in the above-identified patent and that said Letters Patent are hereby corrected as shown below:

Column 7, Line 61      After "its" cancel "intergrity" and substitute therefore --- integrity ---;

Column 8, Line 19      After "by a" cancel "connecging" and substitute therefore --- connecting ---;

Column 8, Line 63, CLAIM 1      At beginning of sentence before "passageways" cancel "fluid-fight" and substitute therefore --- fluid-tight ---.

Signed and Sealed this

Fifth Day of August 1980

[SEAL]

Attest:

SIDNEY A. DIAMOND

Attesting Officer

Commissioner of Patents and Trademarks